(12) United States Patent
Chuang

(10) Patent No.: US 6,200,854 B1
(45) Date of Patent: Mar. 13, 2001

(54) METHOD OF MANUFACTURING DYNAMIC RANDOM ACCESS MEMORY

(75) Inventor: Shu-Ya Chuang, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/466,685

(22) Filed: Dec. 20, 1999

(51) Int. Cl.⁷ .............................................. H01L 21/8242
(52) U.S. Cl. ............................................ 438/253; 438/595
(58) Field of Search ..................................... 438/253, 305, 438/396, 595, 655

(56) References Cited

U.S. PATENT DOCUMENTS 6,057,196 * 5/2000 Gau ....................................... 438/595
6,093,641 * 5/2000 Park ....................................... 438/595

* cited by examiner

Primary Examiner—Chandra Chaudhari

(74) Attorney, Agent, or Firm—Charles C. H. Wu; Charles C. H. Wu & Associates, APC

(57) ABSTRACT

A method of fabricating dynamic random access memory. A conductive layer, a metal silicide layer, a first cap layer and a second cap layer are formed and patterned to form gate structures on the substrate. A first oxide layer is formed over the sidewalls of the metal silicide layer and the conductive layer as well as over the exposed substrate. First spacers are formed on the sidewalls of the gate structures. A second oxide layer is formed over the substrate. Second spacers are formed on the sidewalls of the second oxide layer. A third oxide layer is formed over the substrate. The second spacers, the second oxide layer and a portion of the first oxide layer are removed to expose a portion of the substrate. Contact pads that expose the second cap layer and a portion of the first spacers are formed, and then a first dielectric layer is formed over the entire substrate. Source/drain regions are formed on each side of the third oxide layer in the substrate. Bit lines that connect electrically with the contact pad through a contact in the first dielectric layer are formed. A second dielectric layer is formed over the entire substrate. A storage node electrode that connects electrically with the contact pad through a contact in the second dielectric layer is formed.

36 Claims, 2 Drawing Sheets

METHOD OF MANUFACTURING DYNAMIC RANDOM ACCESS MEMORY

BACKGROUND OF THE INVENTION

1. Field of the Invention

The present invention relates to a method of manufacturing a semiconductor device. More particularly, the present invention relates to a method of manufacturing dynamic random access memory (DRAM) capable of reducing leakage current at junctions.

2. Description of the Related Art

In this information age, dynamic random access memory (DRAM) has become an indispensable component in many electronic products. As more memory capacity is demanded for each DRAM chip, the size of each DRAM device must decrease correspondingly.

To increase the density of DRAM devices, dimensions of each memory cell must decrease. However, reducing the dimensions of a DRAM cell also reduces the size of the capacitor within the memory unit, and hence is likely to reduce the capacitance of the capacitor. A lowered capacitance leads to a faster data loss resulting from an increase in charge leakage through an internal decay mechanism. Because the charges inside a DRAM storage capacitor leak out continuously, the DRAM storage capacitor must be refreshed from time to time to replenish charges. The frequency of refreshing is inversely proportional to capacitance of the capacitor. Because read or write operation cannot be carried out during a refreshing cycle, performance of the DRAM device eventually drops. Therefore, a method capable of producing a high-density and high performance DRAM device with a high capacitance capacitor and low level leakage is required.

Conventionally, the steps for producing DRAM includes forming shallow trench isolation (STI) structures in a substrate to mark out the active regions of memory cells, and then forming transistors in the active regions. After an isolating dielectric layer is formed over the transistors, bit line contact openings are formed in the dielectric layer. Bit lines that connect electrically with the respective transistor terminals through the bit contact openings are formed over the dielectric layer. After the formation of a second dielectric layer over the bit lines, node contact openings are formed and pass through the two dielectric layers. Finally, capacitors that connect electrically with the terminals of the respective transistors through the node contact openings are formed over the second dielectric layer.

In a conventional process of forming the DRAM device, internal stresses are likely to form when the STI structures are created. Dislocations and defects within the active regions of the semiconductor substrate can result in unwanted leakage current at junctions. In addition, since the concentration of dopants in the source/drain regions of the transistors is relatively high and reaches considerable depth and width, parasitic capacitance is usually high, thereby leading to an intensification of junction leakage current. Hence, the DRAM capacitors have to be refreshed more often.

In the meantime, due to the increase in level of device integration and reduction in line width, misalignment of contact opening now occurs more frequently, leading to a shift in contact position. Consequently, a portion of the charges in the node electrode moves towards the substrate, leading to the production of a leakage current and possibly device malfunction. To prevent the adverse effects of misalignment, stricter design rules must therefore be formulated.

SUMMARY OF THE INVENTION

Accordingly, one object of the present invention is to provide a method of fabricating DRAM capable of producing a DRAM device having a smaller junction leakage current, a lower charge-refreshing frequency and an increased device performance.

A second object of the invention is to provide a method of fabricating DRAM that involves simpler processing steps and demands less restrictive design rules. The storage nodes or the bit lines are electrically connected to respective source/drain regions via a contact pad, and hence processing is more predictable and errors due to misalignment can be avoided.

To achieve these and other advantages and in accordance with the purpose of the invention, as embodied and broadly described herein, the invention provides a method of fabricating DRAM. A semiconductor substrate having a plurality of device isolation structures therein is provided. A conductive layer, a metal silicide layer, a first cap layer and a second cap layer are sequentially formed over the substrate. The second cap layer, the first cap layer, the metal silicide layer and the conductive layer are patterned to form gate structures. A first oxide layer is formed over the sidewalls of the metal silicide layer and the conductive layer as well as over the exposed substrate. First spacers are formed on the sidewalls of the gate structures. A second oxide layer conformal to the profile of the substrate is formed. Second spacers are formed on the sidewalls of the second oxide layer. A third oxide layer is formed over the substrate. The second spacers, the second oxide layer and a portion of the first oxide layer are removed to expose a portion of the substrate. Contact pads that expose the second cap layer and a portion of the first spacers are formed, and then a first dielectric layer is formed over the entire substrate. Using the heat in subsequent processing operation, dopants within the contact pads are driven into the substrate on each side of the third oxide layer by diffusion, thereby forming source/drain regions. Bit lines that connect electrically with the contact pad through a contact in the first dielectric layer are formed. A second dielectric layer is formed over the entire substrate. A storage node electrode that connects electrically with the contact pad through a contact in the second dielectric layer is formed.

In the embodiment of the invention, the third oxide layer is formed in the space between the gate structures. Hence, the area of the subsequently formed source/drain junction region can be controlled. In addition, since the source/drain regions are formed by the diffusion of dopants from the contact pads into the substrate in a subsequent heating operation, the concentration of dopants is lower and can reach only a shallow depth. Hence, junction leakage current of the device is greatly reduced.

Furthermore, the bit lines and the storage node electrode are electrically connected to the respective source/drain regions through a contact pad, hence the processing steps are more predictable and errors due to misalignment can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
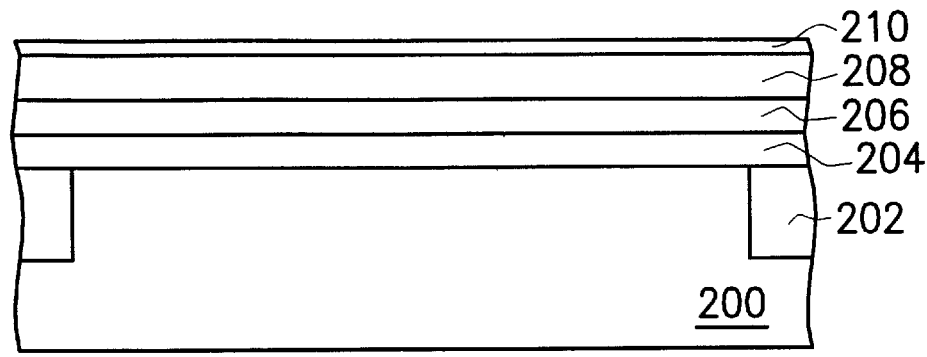
FIGS. 1A through 1E are schematic cross-sectional views showing the progression of manufacturing steps for producing a DRAM cell unit according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic cross-sectional views showing the progression of manufacturing steps for producing a DRAM cell unit according to one preferred embodiment of the invention.

First, as shown in FIG. 1A, a substrate 200 having a plurality of device isolation structures 202 therein is provided. A conductive layer 204, a metal silicide layer 206, a first cap layer 208 and a second cap layer 210 are sequentially formed over the substrate 200. The conductive layer 204, the metal silicide layer 206, the first cap layer 208 and the second cap layer 210 can be a doped polysilicon layer, a tungsten silicide layer, a nitride layer and an oxide layer, respectively, for example. The conductive layer 204, the metal silicide layer 206 and the first cap layer 208 preferably have a thickness of about 1000 Å, whereas the second cap layer 210 preferably has a thickness of about 200 Å.

Figure 1B:
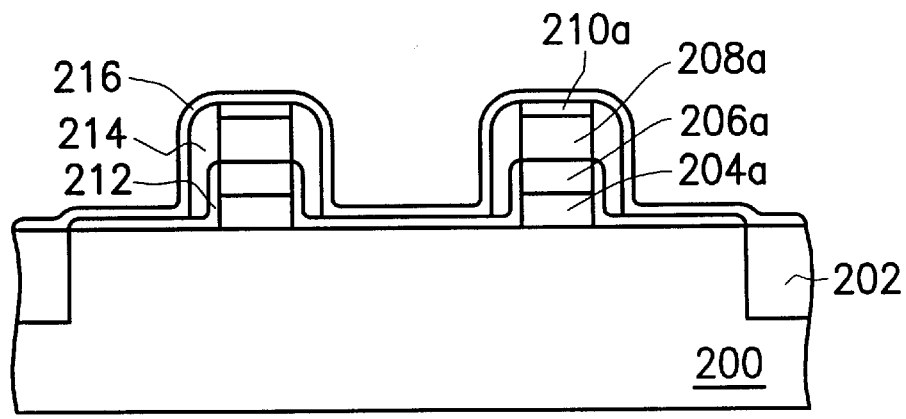

As shown in FIG. 1B, conventional photolithographic and etching techniques are used to remove a portion of the second cap layer 210, the first cap layer 208, the metal silicide layer 208 and the conductive layer 204 to form gate structures. Each gate structure comprises a second cap layer 210a, a first cap layer 208a, a metal silicide layer 206a and a conductive layer 204a. An oxide layer 212 is formed over the sidewalls of the metal silicide layer 206a and the conductive layer 204a as well as the exposed substrate 200. The oxide layer 212 preferably having a thickness of between about 100 Å and 200 Å is formed by, for example, rapid thermal operation (RTO). Silicon nitride is next deposited over the substrate 200 to a thickness of about 500 Å to 1000 Å, and then the silicon nitride layer (not shown in the figure) is etched to form silicon nitride spacers 214. An oxide layer 216 having a thickness of about 100 Å to 200 Å and conformal to the substrate profile is formed.

Figure 1C:
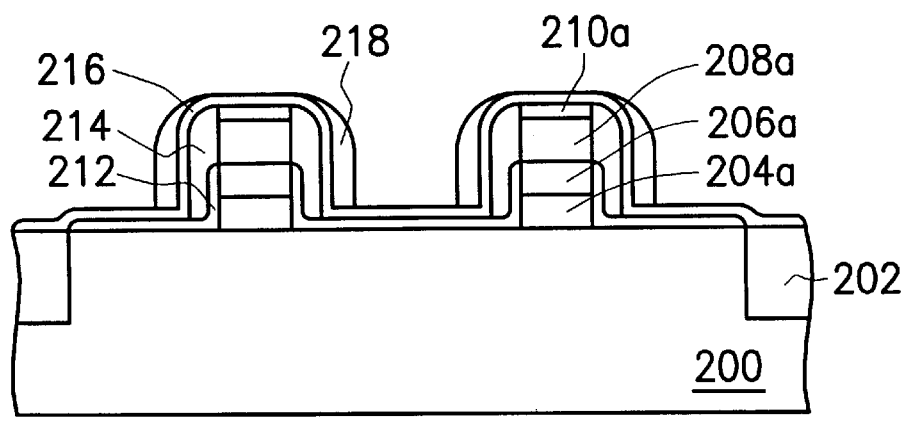

As shown in FIG. 1C, silicon nitride is again deposited over the substrate 200 to a thickness of about 1000 Å to 1200 Å. The silicon nitride layer (not shown in the figure) is etched to form silicon nitride spacers 218.

Figure 1D:
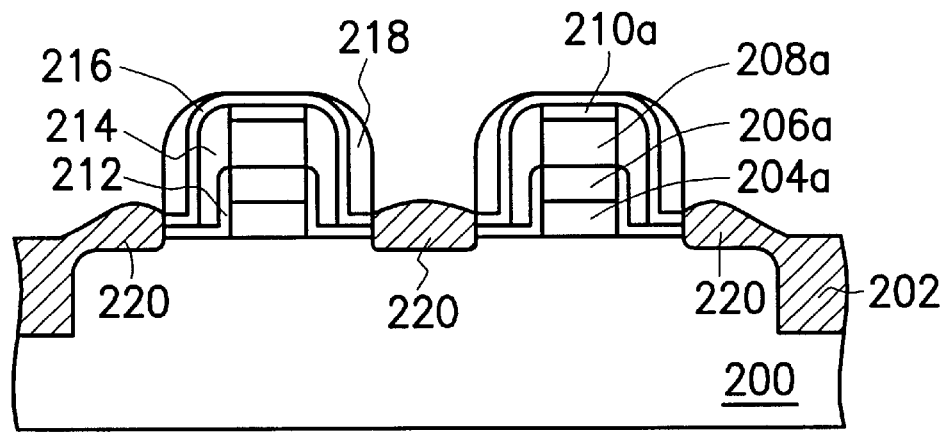

As shown in FIG. 1D, an oxide layer 220 having a thickness of about 1000 Å is formed over the substrate 200. To form a fine oxide layer 220, thermal oxidation or wet oxidation method can be used.

Figure 1E:
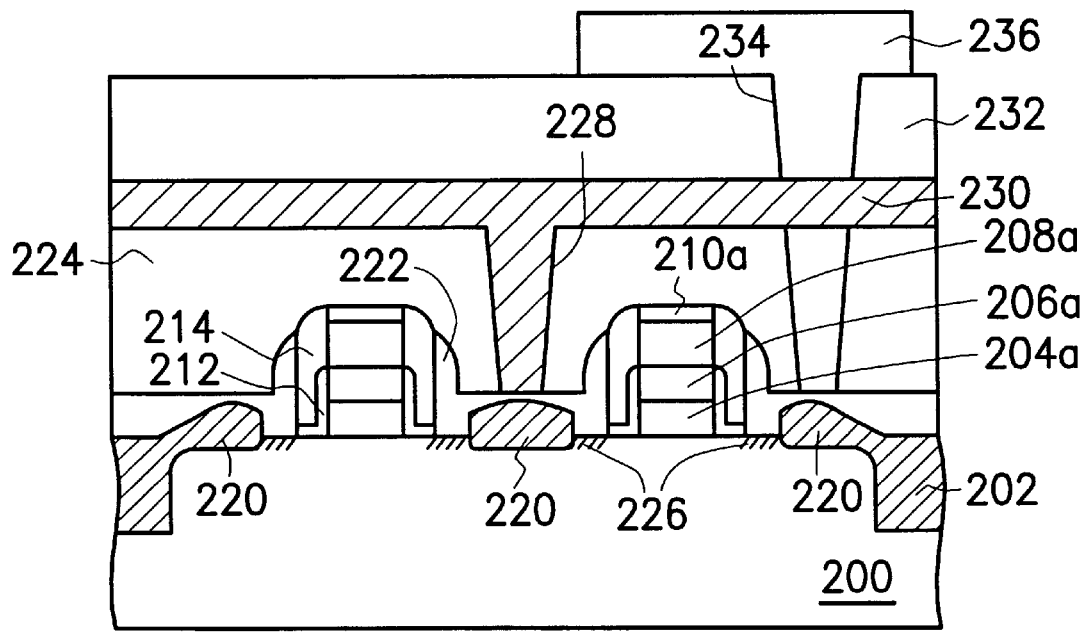

As shown in FIG. 1E, the silicon nitride spacers 218 are removed. The silicon nitride spacers 218 can be removed by, for example, wet etching using phosphoric acid. The oxide layer 216 and a portion of the oxide layer 212 are next removed to expose a portion of the substrate 200. The oxide layers 216 and 212 can be removed using, for example, hydrofluoric acid in a wet etching operation.

Polysilicon (not shown in the figure) is deposited over the substrate 200 to form a polysilicon layer (dopants can also be added). The polysilicon layer is patterned to form contact pads 222 while exposing the second cap layer 210a and a portion of the silicon nitride spacers 214. Since a portion of the second cap layer 210 (also an oxide layer) is also removed in addition to the oxide layer 216 and a portion of the oxide layer 212 in the wet etching operation, the first cap layer 208a and a portion of the silicon nitride spacers 214 may be exposed as well.

A dielectric layer 224 that covers the entire substrate 200 is formed. During a densification step of the dielectric layer 224 or a thermal step for oxidizing the dielectric layer 224, the contact pads 222 are also heated up. Consequently, the dopants inside the contact pads 222 are activated and diffused into substrate region nearby. However, due to the presence of the oxide layer 220 above the substrate 200, the area into which the dopants are capable of diffusing is restricted. Hence, source/drain regions 226 are formed only in the substrate regions on each side of the oxide layer 220. In addition, since the source/drain regions 226 are formed by the diffusion of dopants from the contact pads 222, the concentration of dopants is lighter and depth of the doped layer is shallower. Junction leakage current of the DRAM device is reduced. With small and lightly doped source/drain regions 226 and a small leakage current, parasitic capacitance is greatly reduced and quality of the DRAM device is improved.

A bit line contact opening 228 that expose one of the contact pads 222 is formed in the dielectric layer 224. Conductive material such as polysilicon is deposited into the contact opening 228 and over the dielectric layer 224 to form a conductive layer (not shown in the figure). The layer of conductive material is patterned to form a conductive layer 230 that connects electrically with the contact pad 222. The conductive layer 230 serves as an electrical connection to a source/drain region 226 via a contact pad 222. Another dielectric layer 232 such as an inter-polysilicon dielectric layer is formed over the substrate 200. The dielectric layer 232 can be formed by, for example, chemical vapor deposition. A storage node contact opening 234 that exposes the contact pad 222 is formed and passes through both the inter-polysilicon dielectric layer 232 and the dielectric layer 224. Conductive material such as polysilicon is deposited into the contact opening 234 and over the inter-polysilicon dielectric layer 232 to form a conductive layer (not shown in the figure). The layer of conductive material is patterned to form a conductive layer 236 that connects electrically with the contact pad 222.

In the invention, the bit line or the conductive layer 230 is electrically connected to the source/drain region 226 through a contact pad 222. Similarly, the storage node electrode or the conductive layer 236 is electrically connected to the source/drain region 226 via the contact pad 222. Hence, the overlay design rules governing the bit line contact opening 228 and the storage node contact opening 234 are greatly relaxed and the formation process is more predictable.

In summary, the advantages of fabricating DRAM using the method of the invention at least includes:

1. Design rules governing the fabrication is relaxed, and the processing steps are simplified.

2. The bit line and the storage node electrode are electrically connected to the source/drain region through a contact pad. Hence, processing is more predictable and errors due to misalignment can be avoided.

3. Since an oxide layer is formed in the space between neighboring gate electrode structures, junction area of the subsequently formed source/drain regions can be reduced. In addition, the source/drain regions are formed by dopants diffusing from the contact pad into the substrate due to heat, so the concentration of dopants in the substrate is low and the spread of dopants is limited. Junction leakage current from the device is reduced and frequency of refreshing is thereby minimized. Consequently, overall performance of the device will improve.

It will be apparent to those skilled in the art that various modifications and variations can be made to the structure of the present invention without departing from the scope or spirit of the invention. In view of the foregoing, it is intended that the present invention cover modifications and variations of the invention provided they fall within the scope of the following claims and their equivalents.

What is claimed is:

1. A method of fabricating dynamic random access memory, comprising the steps of:
    providing a substrate having a plurality of device isolation structures therein;
    sequentially forming a conductive layer, a metal silicide layer, a first cap layer and a second cap layer;
    patterning the second cap layer, the first cap layer, the metal silicide layer and the conductive layer to form a gate structure that exposes a portion of the substrate;
    forming a first oxide layer over the exposed substrate and sidewalls of the metal silicide layer and the conductive layer;
    forming first spacers on sidewalls of the gate structure;
    forming a second oxide layer conformal to the substrate profile;
    forming second spacers over the second oxide layer;
    forming a third oxide layer over the substrate;
    removing the second spacers;
    removing the second oxide layer and a portion of the first oxide layer to expose a portion of the substrate;
    forming a conformal contact pad over the exposed substrate and the first spacers;
    forming a dielectric layer over the substrate;
    forming source/drain regions in the substrate on each side of the third oxide layer;
    forming a bit line contact opening that exposes a portion of the contact pad in the first dielectric layer;
    forming a bit line that connects electrically with the exposed contact pad;
    forming a second dielectric layer over the substrate;
    forming a storage node contact opening that passes through the second dielectric layer and the first dielectric layer and exposes a portion of the contact pad; and
    forming a storage node electrode that connects electrically with the contact pad.

2. The method of claim 1, wherein the conductive layer includes a polysilicon layer.

3. The method of claim 2, wherein the conductive layer has a thickness of about 1000 Å.

4. The method of claim 1, wherein a material for forming the metal silicide layer includes tungsten silicide.

5. The method of claim 4, wherein the metal silicide layer has a thickness of about 1000 Å.

6. The method of claim 1, wherein the first cap layer includes a silicon nitride layer.

7. The method of claim 6, wherein the first cap layer has a thickness of about 1000 Å.

8. The method of claim 1, wherein the second cap layer includes a silicon oxide layer.

9. The method of claim 8, wherein the second cap layer has a thickness of about 200 Å.

10. The method of claim 1, wherein the step of forming the first oxide layer includes rapid thermal oxidation.

11. The method of claim 10, wherein the first oxide layer has a thickness of between about 100 Å and 200 Å.

12. The method of claim 1, wherein material for forming the first spacers includes silicon nitride.

13. The method of claim 1, wherein the third oxide layer has a thickness of about 1000 Å.

14. The method of claim 1, wherein a material for forming the second spacers includes silicon nitride.

15. The method of claim 1, wherein a material for forming the contact pad includes doped polysilicon.

16. The method of claim 1, wherein the step of forming the source/drain regions includes performing a thermal operation after the first dielectric layer is formed.

17. The method of claim 16, wherein the thermal operation includes densifying the first dielectric layer.

18. The method of claim 16, wherein the thermal operation includes a thermal step for oxidizing the first dielectric layer.

19. The method of claim 1, wherein the step of forming the bit line includes the substeps of:
    forming a conductive layer over the substrate in its entirety and filling the bit line contact opening; and
    patterning the conductive layer.

20. The method of claim 1, wherein the step of forming the storage node electrode includes the substeps of:
    forming a conductive layer over the substrate in its entirety and filling the storage node contact opening; and
    patterning the conductive layer.

21. A method of forming a semiconductor device with a shallow junction source/drain region, comprising the steps of:
    providing a substrate;
    forming device isolation structures in the substrate to pattern out active regions;
    forming a gate structure over the substrate, wherein the gate structure includes a conductive layer, a metal silicide layer, a first cap layer and a second cap layer;
    forming a first oxide layer over the exposed substrate and sidewalls of the metal silicide layer and the conductive layer;
    forming first spacers on sidewalls of the gate structure;
    forming a conformal second oxide layer over the substrate;
    forming second spacers over the second oxide layer;
    removing a portion of the second oxide layer and a portion of the first oxide layer to expose a portion of the substrate;
    forming a third oxide layer over the exposed substrate;
    removing the second spacers;
    forming a contact pad over the first spacers and the substrate;
    performing a thermal operation; and
    forming a source/drain region in the substrate.

22. The method of claim 21, wherein the conductive layer includes a polysilicon layer.

23. The method of claim 22, wherein the conductive layer has a thickness of about 1000 Å.

24. The method of claim 21, wherein material for forming the metal silicide layer includes tungsten silicide.

25. The method of claim 24, wherein the metal silicide layer has a thickness of about 1000 Å.

26. The method of claim 21, wherein the first cap layer includes a silicon nitride layer.

27. The method of claim 26, wherein the first cap layer has a thickness of about 1000 Å.

28. The method of claim 27, wherein the second cap layer includes a silicon oxide layer.

29. The method of claim 28, wherein the second cap layer has a thickness of about 200 Å.

30. The method of claim 21, wherein the step of forming the first oxide layer includes rapid thermal oxidation.

31. The method of claim 30, wherein the first oxide layer has a thickness of between about 100 Å and 200 Å.

32. The method of claim 21, wherein a material for forming the first spacers includes silicon nitride.

33. The method of claim 21, wherein the third oxide layer has a thickness of about 1000 Å.

34. The method of claim 21, wherein a material for forming the second spacers includes silicon nitride.

35. The method of claim 21, wherein a material for forming the contact pad includes heavily doped polysilicon.

36. The method of claim 21, wherein the step of forming the source/drain region includes using the heat provided by the thermal operation to activate the dopants inside the contact pad so that the dopants diffuse into the substrate region on each side of the third oxide layer.

* * * * *